United States Patent [19]

Dietz

[11] 4,227,123
[45] Oct. 7, 1980

[54] SWITCHING AMPLIFIER FOR DRIVING A LOAD THROUGH AN ALTERNATING-CURRENT PATH WITH A CONSTANT-AMPLITUDE, VARYING DUTY CYCLE SIGNAL

[75] Inventor: Wolfgang F. W. Dietz, New Hope, Pa.

[73] Assignee: RCA Corporation, New York, N.Y.

[21] Appl. No.: 11,556

[22] Filed: Feb. 12, 1979

[51] Int. Cl.² .................... H01J 29/70; H01J 29/76
[52] U.S. Cl. ............................ 315/397; 315/408
[58] Field of Search .................. 315/408, 396, 397

[56] References Cited

U.S. PATENT DOCUMENTS

| | | | |
|---|---|---|---|
| 3,984,729 | 10/1976 | Steckler et al. | 315/408 |
| 3,999,101 | 12/1976 | Fischman et al. | 315/408 |

*Primary Examiner*—Theodore M. Blum
*Attorney, Agent, or Firm*—Eugene M. Whitacre; Paul J. Rasmussen; Joseph J. Laks

[57] ABSTRACT

An amplifier includes first and second switches coupled at a junction to form a series circuit. The series circuit is serially coupled with an inductor across a source of energizing potential. A capacitor couples the junction between the switches to a load. The switches conduct alternately under the control of a duty cycle modulator. The duty cycle modulation tends to vary the amplitude of the two opposite-polarity portions of the signal appearing across the load. A clamp is coupled to the junction of the series switch circuit and the inductor. The clamp operates during a first of the two alternate switch conduction intervals to clamp the voltage across the inductor at a fixed value. Since a direct voltage cannot be established across an inductor, the voltage across the inductor during the second switch conduction interval is established by the clamp voltage and the duty cycle, and varies with duty cycle. The amplitude of the signal at the junction of the two switches varies with duty cycle variations in such a manner as to maintain the signal of one polarity across the load at a constant amplitude.

13 Claims, 11 Drawing Figures

SWITCHING AMPLIFIER FOR DRIVING A LOAD THROUGH AN ALTERNATING-CURRENT PATH WITH A CONSTANT-AMPLITUDE, VARYING DUTY CYCLE SIGNAL

BACKGROUND OF THE INVENTION

This invention relates to amplifiers for driving a load through an alternating-current path with a constant-amplitude, varying duty cycle signal. An example of such an amplifier is a driver for a horizontal output transistor of a television deflection system.

Television display systems conventionally scan a lighted raster area on the face of a picture tube by recurrently scanning an electron beam vertically at a relatively low rate and horizontally at a relatively high rate. Because of the high horizontal scanning rate, it is important to reduce the amount of energy converted to heat during each horizontal deflection cycle in order to reduce the total power consumption. To this end, the horizontal deflection is commonly accomplished by the use of electronic switches, which may be turned on and off at the high deflection rates and which in principle consume no power in either switching state.

When the horizontal deflection switching device is a bipolar transistor, the base must be driven with sufficient current during the conductive or ON time of the transistor to allow the collector current to be controlled by the collector circuit rather than by the base current. In this saturated operating condition, excess or surplus charge carriers are stored in the base region of the transistor. As is known, it is necessary to sweep the base region clear of stored charge carriers before control of the collector current by the base can be reasserted. That is, in order to switch the transistor into the nonconducting or OFF state, a reverse voltage must be applied to the base-emitter junction for an interval sufficient for removal of the excess charge carriers. Only after the excess carriers are removed does the collector current cease. The time required to switch the transistor into the nonconducting condition after application of a reverse bias to the base-emitter junction depends upon the geometry of the transistor and upon the number of excess charge carriers. For a given geometry and base current, the number of excess carriers decreases with increasing collector current, and consequently the time required to switch the transistor into the nonconducting state decreases as the collector current increases.

The images to be displayed are encoded with timing information in the form of composite video. The picture information content is separated from the synchronizing signals in the television receiver and modulates an electron beam which illuminates the raster area. The synchronizing signals are applied to the deflection circuits for controlling the deflection timing in a manner to allow the coded images to be displayed.

In current television practice, the horizontal output stage is called upon to produce direct voltage for energizing various portions of the television receiver as well as producing deflection current. The loads may be variable and of substantial magnitude, as for example the picture tube ultor, which may require 60 watts or more and which varies with picture content. The variations in the load presented to the horizontal output stage causes the peak collector current of the horizontal output transistor to vary from time to time. Thus, the switch-off time of the transistor may vary, thereby causing variations in picture timing and apparent distortion of the images displayed on the raster.

A feedback loop arranged to control the deflection timing circuits in such a manner as to compensate for delay variations in the horizontal output stage is described in U.S. Patent Application Ser. No. 948,775, filed Oct. 5, 1978 in the name of Balaban et al. In the Balaban arrangement, a phase-control loop varies a delay circuit interposed between the source of synchronizing pulses and the horizontal output transistor driver circuits. The phase-control loop compares the horizontal retrace pulses with the synchronizing signals and reduces the phase error therebetween.

Since the recurrent deflection interval as defined by the interval between horizontal synchronizing pulses is constant, variation in the drive signal timing to control the turn-off time of the horizontal output transistor may cause a duty-cycle variation of the horizontal drive signal. If the driver stage is AC (alternating-current) coupled to the base of the horizontal output transistor as for example by a transformer as described in U.S. Pat. No. 3,302,033 issued to Goodrich, the duty cycle variation of the constant-amplitude drive signal may result in unwanted amplitude variations of the horizontal drive signal at the base. For example, an increase in horizontal output transistor collector current resulting from an increase in beam current results in a decrease in the delay between the application of a negative-going portion of the drive signal to the base of the horizontal output transistor and the resulting turn-off time and retrace pulse. If uncorrected, the retrace pulse will be advanced in time relative to the encoded video information, and the encoded information will be relatively delayed. As viewed on the raster, the picture information will be displaced to the right from the desired position. A phase-correction loop will delay the application of the turn-off portion of the base drive in a compensating manner. This, however, may increase the duration of that portion of the horizontal drive signal tending to keep the horizontal output transistor conductive. Since the interpulse period is fixed, this decreases the OFF portion of the drive signal (that part of the drive signal tending to turn the output transistor OFF), resulting in a duty cycle change. The drive signal when AC coupled must have equal positive and negative-going portions relative to the average value of the signal at the base of the horizontal output transistor, with the result that the increase in the duration of the ON-portion of the drive signal decreases its amplitude and increases the amplitude of the OFF portion. The decreased amplitude of the ON portion of the horizontal output transistor drive signal reduces the base current during this interval. The reduced base current further reduces the excess charge carriers and further enhances the decrease in storage time. Thus, the combination of duty cycle modulation and AC coupling undesirably reduces the effective gain of the phase-control loop.

A self-regulating arrangement is described in the article "A New Horizontal Output Deflection Circuit" by Peter Wessel, which appeared in the IEEE Transactions on Broadcast and Television Receivers, Vol. BTR-18, August, 1972. In the Wessel arrangement, a horizontal output transistor is AC coupled to a driver by a transformer. Such driver transformers are commonly used to store energy during the ON-time of the driver transistor and to couple the energy to the base of the following horizontal output transistor during the OFF-time of the driver transistor. The drive waveform has a fixed turn-off time and a turn-on time which is variable under the control of a voltage feedback loop. In the Wessel arrangement, the variation of the ON-portion of the drive waveform results in a duty cycle variation which varies the delay between the time the reverse bias voltage is applied to the base of the horizontal output transistor and the resulting retrace pulse. Undesirable distortion in the displayed image results.

It is desirable to maintain the AC coupling between the driver and the horizontal output transistor, and to correct or avoid the timing errors described above resulting from duty cycle variations. It is also desirable to reduce the effective voltage applied to the driver stage as energization potential without incurring dissipative losses. More generally, it is desirable to have an amplifier which when AC-coupled to a load and driving the load with a duty-cycle varied signal produces across the load a constant-amplitude portion relative to the average or direct voltage value.

SUMMARY OF THE INVENTION

An amplifier for driving a load through an alternating-current path with a signal having duty cycle variations includes first and second controllable switches, each switch including a controlled main current conducting path and a control electrode. The main current conducting paths are coupled together at a juncture and controlled for conduction during mutually alternate first and second time intervals. An inductor is serially coupled with a switch and with a source of energizing potential for establishing an operating potential across said switches during said first interval which is less than the full potential of the source of energizing potential. The juncture and the load are coupled through an alternating-current path for creating a path for the flow of alternating current therebetween. The duty cycle variations tend to cause variations of the magnitude of the peak alternating voltage across the load. Means are coupled to the inductance for establishing a substantially fixed voltage across the inductance during the first interval.

DESCRIPTION OF THE INVENTION

Figure 1:
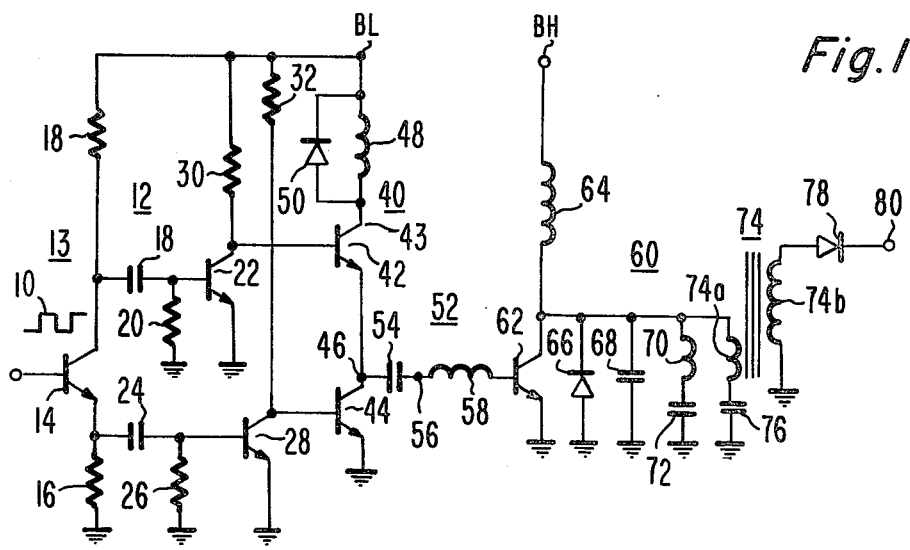
FIG. 1 is a schematic diagram of a portion of a television apparatus embodying the invention.

FIG. 1, generally speaking, illustrates duty-cycle modulated pulses 10 applied to a predriver designated generally as 12 and thence to a driver stage 40. Driver 40 is AC coupled to a conventional transistorized horizontal deflection circuit 60.

In predriver 12, a paraphase amplifier 13 including an NPN transistor 14 and resistors 16 and 18 receives duty-cycle modulated pulses 10. The out-of-phase output of the collector of transistor 14 is coupled by way of a series capacitor 18 and a resistor 20 to the base of an NPN transistor 22. The in-phase output of the paraphase amplifier is taken from the emitter of transistor 14 through a capacitor 24 and appears across a resistor 26 and the base-emitter junction of an NPN transistor 28. Transistors 22 and 28 are arranged with resistors 30 and 32, respectively, as inverting common-emitter amplifiers. The outputs of predriver 12 are taken from the collectors of transistors 22 and 28 and are applied to the bases of NPN switching transistors 42 and 44, respectively, of driver 40. The emitter of transistor 44 is grounded, and the emitter of transistor 42 is coupled at a juncture 46 to the collector of transistor 44. Collector 43 of transistor 42 is coupled by way of an inductor 48 to a source BL of a relatively low direct operating voltage. A clamp diode 50 has its anode connected to the collector of transistor 42 and its cathode connected to supply BL.

Horizontal output transistor base drive signals are taken from juncture 46 of driver 40 by way of an alternating-current (AC) coupling circuit designated generally as 52 and including the series combination of a capacitor 54 and an inductor 58 having a juncture 56 therebetween. The end of coupling circuit 52 remote from juncture 46 is connected to the base of an NPN horizontal output transistor 62 of horizontal output stage 60. The emitter of transistor 62 is connected to ground and the collector is coupled by way of an inductor 64 to a source BH of relatively high direct operating voltage. The collector of transistor 62 is connected as is known to the cathode of a damper diode 66, the anode of which is connected to ground. A retrace capacitor 68 and the series combination of the deflection windings 70 and S-shaping capacitor 72 are coupled across damper diode 66. One end of a primary winding 74a of a transformer 74 is connected to the collector of transistor 62. The other end of winding 74a is coupled to ground by a capacitor 76. A secondary winding 74b of transformer 74 has one end connected to ground and the other end connected to a high-voltage rectifier illustrated as a diode 78. The other end of diode 78 is connected to a terminal 80 to which the ultor of a kinescope, not shown, may be connected for energization thereof.

The operation of horizontal output stage 60 is conventional and well known in the art. For purposes of understanding the present invention, it is sufficient to know that the base of transistor 62 is driven through inductor 58 with recurrent square or rectangular waves of voltage of variable duty cycle.

In operation, signals 10 applied to the input of paraphase amplifier 13 produce switching signals of mutually opposite phase at the bases of transistors 42 and 44 of driver 40. Consequently, transistors 42 and 44 become conductive during alternative intervals.

During a first interval, transistor 42 conducts and transistor 44 is nonconducting. During the first interval, the collector voltage V43 of transistor 42 is less than the supply voltage BL, as illustrated by V43 of FIG. 2a in the interval T1–T2. During previous cycles of operation, capacitor 54 became charged to a voltage equal to the average of the positive and negative excursions at juncture 46, as illustrated by V54 of FIG. 2b. During the interval T1–R2, transistor 42 is saturated, and the voltage at juncture 46 rises to substantially equal voltage V43 then appearing at collector 43 of transistor 42, which is determined in a manner described below. Because the impedance of transistor 42 in its conductive state is low, the voltage at circuit point 46 is the difference between supply voltage BL and the voltage then across inductor 48, as illustrated in FIG. 2a.

In FIG. 2a, voltage V46 is illustrated for clarity as being slightly less than V43. Actually, these voltages will differ only by the saturation voltage of transistor 42. In the interval T1–T2, increasing current IL48 flows in inductor 48 as illustrated in FIG. 2d. The current passes in succession through the collector-emitter conduction path of transistor 42, capacitor 54, inductor 58 and through the base-emitter junction of transistor 62 as current IB62 illustrated in FIG. 2e to render transistor 62 conductive. The interval T1–T2 may correspond to the second half of the horizontal trace interval.

Figure 2:
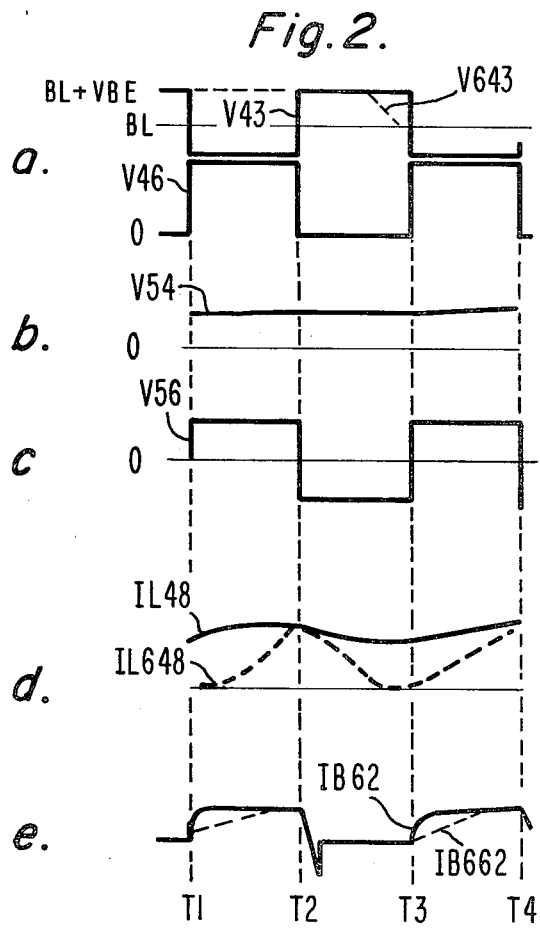
FIGS. 2 and 3 illustrate as amplitude-time graphs certain voltages and currents occurring in the arrangement of FIG. 1 during operation.
Figure 3:
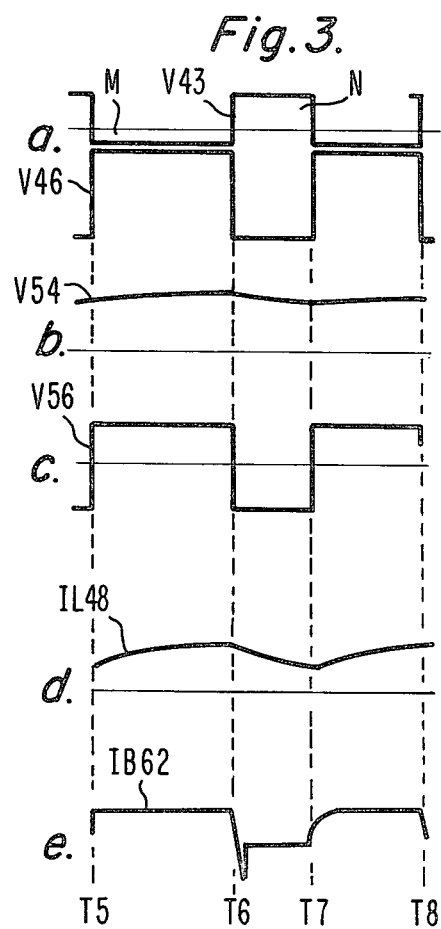

At time T2, drive waveform 10 makes a negative excursion. This negative excursion is coupled to the base of transistor 28, thereby cutting it off and rendering transistor 44 conductive. At the same time, transistor 42 is rendered nonconductive. With transistor 42 nonconductive, the energy associated with the magnetic field of inductor 48 causes voltage V43 at the collector of transistor 42 to rise or become more positive. Voltage V43 rises until it reaches 1 Vbe above the voltage of supply BL, at which time diode 50 becomes conductive. With diode 50 conductive, a path is formed for the flow of current through inductor 48, and voltage V43 at the collector of transistor 42 does not rise further. Voltage V43 in the interval T2–T3 is illustrated in FIG. 2a as being above supply voltage BL by the forward voltage (VBE) of diode 50. FIGS. 2 and 3 are not to scale to improve clarity.

With transistor 44 conducting and transistor 42 nonconducting in the interval T2–T3, the voltage at circuit point 46 decreases to the saturation voltage of transistor 44. Since this saturation voltage is small, the voltage at circuit point 46 in the interval T2–T3 may be considered to be ground. The negative-going excursion at the circuit point 46 at time T2 is coupled to circuit point 56, and makes it negative with respect to ground to begin the removal of charge carriers from the base of transistor 62 to turn it off and initiate the retrace interval. The voltage at circuit point 56 is illustrated by V56 of FIG. 2c.

Due to the direct-current decoupling or blocking provided by capacitor 54, the direct component of voltage V46 does not appear at circuit point 56. Consequently, the positive and negative-going excursions of voltage V46 as coupled to point 56 have peak values which are dependent upon the amplitude and duty cycle of the signal. As illustrated in FIG. 2c for a 50% duty cycle, the peak positive and negative excursions have equal amplitudes.

At time T3, transistor 42 is once again turned on and transistor 44 is turned off. Voltage V43 at the collector of transistor 42 decreases to a value below the supply voltage, and diode 50 becomes nonconductive. The voltage at circuit point 46 rises to substantially equal V43. The positive-going excursion is coupled by capacitor 54 to circuit point 56 to apply a forward bias voltage across the series connection of inductor 58 and the base-emitter junction of transistor 62.

The recurrent alternate conduction of transistors 42 and 44 as described produces a constant-amplitude voltage at circuit point 56 for forward-biasing transistor 62. As mentioned, prior art arrangements allow those portions of voltage V56 tending to foward-bias the base-emitter junction of horizontal output transistor 62 to vary as a function of the duty cycle of the drive. In the inventive arrangement, changes in duty cycle do not affect the magnitude of the forward-bias portions of the drive. For purposes of explanation, assume that the duty cycle of signals 10 changes in such a manner as to cause the forward-bias portion of drive signal V56 to increase in duration by comparison with that described in FIG. 2. This would be the case, for example, if the regulated voltage were to decrease in a Wessel-deflection circuit, or if an increase in collector current decreases the output transistor storage time and causes a compensating increase in on-time duration in a phase-control loop situation. In prior art arrangements, such a change in duty cycle of the horizontal output base drive would result in a decrease in the amplitude of the forward-drive portion and an increase in the amplitude of the negative-drive portion.

In the arrangement of FIG. 1, the amplitude of the forward-bias portion of the drive signal AC coupled to circuit point 56, does not change with changes in the duty cycle of the drive signal. Generally speaking, the arrangement of FIG. 1 changes the amplitude of the voltage at the collector of transistor 42 during the period in which transistor 42 conducts in such a manner as to create a change in the amplitude of the drive signal at circuit point 46 which compensates for the expected change at point 56 attributable to the AC coupling.

For purposes of explanation, it is assumed that drive pulses 10 vary in duty cycle so as to make transistor 42 conductive for a longer period than transistor 44. As illustrated in FIG. 3, time T5–T6 exceeds time T6–T7. After several cycles of operation at the changed duty cycle, transient effects will have subsided. Immediately before time T5, transistor 44 and diode 50 are conductive, and transistor 42 is nonconductive. Voltage V43 at collector 43 of transistor 42 is positive with respect to supply voltage BL by the forward voltage drop of diode 50, which is 1 Vbe. Thus, in the interval preceding time T5, voltage V43 at the collector of transistor 42 is clamped at the same value to which it was clamped before the duty cycle was changed, as illustrated in FIG. 3a.

At time T5, transistor 42 is turned on and transistor 44 is turned off. Voltage V43 decreases sharply as current flows through inductor 48 as illustrated by IL48 of FIG. 3d, through transistor 42, coupling circuit 52 and the base-emitter junction of transistor 62 to render transistor 62 conductive. At the same time, voltage V46 at circuit point 46 takes a sharp positive excursion.

The voltage at the collector of transistor 42 during the interval T5–T6 in which transistor 42 is conductive is established by average-value considerations. Since a direct voltage cannot be maintained across an inductor, the average of the positive and negative-going excursions across inductor 48 must equal supply voltage BL. Thus, the product of volts and time at the collector of transistor 42 during the positive and negative-going portions relative to supply voltage BL must be equal to and opposite each other. In simpler terms, the area M included between V43 and BL in the interval T5–T6 as illustrated in FIG. 3a must equal corresponding area N in interval T6–T7. Since voltage V43 in the interval T6–T7 is established by the forward voltage of clamp diode 50, the effect of the duty cycle change is to decrease area N, whereby area M must also decrease. Since area M is decreasing as the interval T5–T6 increases, the decrease in voltage at the collector of transistor 42 is less in the interval T5–T6 than in corresponding interval T1–T2.

The presence of inductor 48 and clamp diode 50 can thus be seen to effect a change in the voltage at the collector of transistor 42 with changes in duty cycle.

During the interval in which transistor 42 is conductive, it has a low impedance and the voltage at circuit point 46 is substantially equal to voltage V43 as indicated by V46 of FIG. 3a. When transistor 42 is ON and transistor 44 is OFF, the voltage at circuit point 46 is the difference between supply voltage BL and V43. Thus, the duty-cycle dependent decrease in the peak amplitude of V43 is translated into a corresponding increase in the peak amplitude of voltage V46 at circuit point 46. The increased peak value of the excursion at circuit point 46 represents an increase in the average value of the voltage at that point. Capacitor 54 is charged to this greater average voltage during the transient interval immediately following the change in duty cycle. The increased voltage across capacitor 54 is illustrated by V54 in FIG. 3b.

The direct component of voltage V46 is lost by coupling through capacitor 54. At circuit point 56, the product of amplitude and time of the positive and negative-going excursions must be equal. Thus, the expected result of an increase in interval T5-T6 relative to interval T6-T7 is a decrease in the amplitude of the positive-going portion. However, the increase in the amplitude of voltage V46 as described in conjunction with FIG. 3a compensates for the tendency to decrease, whereby the amplitude of V56 in the interval T5-T6 is the same as the amplitude in corresponding interval T1-T2.

The peak-to-peak amplitude of voltage V46 at circuit point 46 is increased as illustrated in FIG. 3 as compared with FIG. 2. The positive-going portion of voltage V56 at circuit point 56, however, remains constant as described above. Since the peak-to-peak magnitude of the waveform is not affected by coupling through capacitor 54, the negative-going portion of V56 in the interval T6-T7 as illustrated in FIG. 3c is greater than that illustrated in corresponding interval T2-T3 in FIG. 2c. Consequently, the negative-going voltage applied to the series combination of inductor 58 and the base-emitter junction of transistor 62 near time T6 changes with changes in duty cycle, notwithstanding that the forward base drive remains constant. The increased negative voltage near time T6 as compared with that near time T2 tends to increase the voltage which sweeps charge carriers out of the base region of transistor 62. This produces a third-order effect on the turn-off time of the output transistor.

For example, if the collector current increases above the normal value for the reasons given previously, the excess charge stored in the base region of the horizontal output transistor tends to decrease. The decrease in excess stored charge tends to decrease the turn-off time of the horizontal output transistor, and the phase control loop compensates this first-order effect by increasing the duration of the turn-on or forward base drive to the transistor. As mentioned, this results in the prior art in a second-order effect tending to decrease the amplitude of the forward base drive. This second-order effect is compensated by the inventive arrangement so as to maintain the amplitude of the forward drive constant. Thus, the amplitude of the forward drive is maintained constant and tends to maintain the amount of excess charge stored in the base region of the output transistor constant whereby the turn-off time also remains constant. However, since the negative turn-off voltage at time T6 increases by comparison with that at time T3, the excess stored charge tends to be removed more quickly with increases in collector current. Thus, there is a third-order effect tending to decrease the turn-off time with increases in the collector current of the horizontal output transistor. This third-order effect may be overcome by a slight overcompensation, whereby the amplitude of the forward drive is not only maintained constant but becomes slightly larger with increases in the collector current of the horizontal output transistor.

FIG. 4 illustrates several alternative arrangements of the invention. In FIG. 4, driver 40, AC coupling circuit 52 and transistor 62 are illustrated as being separated from the remainder of the circuit of FIG. 1 for clarity. In FIG. 4a, a voltage source illustrated as a battery 102 is coupled in series with diode 50. The negative terminal of battery 102 is coupled to source BL, and the positive terminal is connected to the cathode of diode 50. The effect of added battery 102 is to increase the positive voltage to which the collector of transistor 42 is clamped during the nonconduction time of transistor 42. Selection of the voltage of battery 102 allows control of the voltage applied to transistor 42 during its conductive interval. In FIG. 4b, a battery 108 couples the cathode of diode 50 to ground for an equivalent purpose. The energy coupled from inductor 48 to the voltage source represented by the battery may be reused.

Figure 4A:
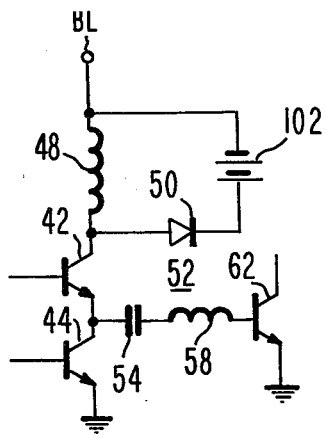
FIG. 4 illustrates in schematic diagram form several alternative amplifier circuits embodying the invention.
Figure 4B:
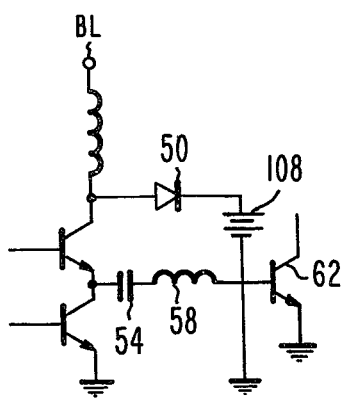
Figure 4C:
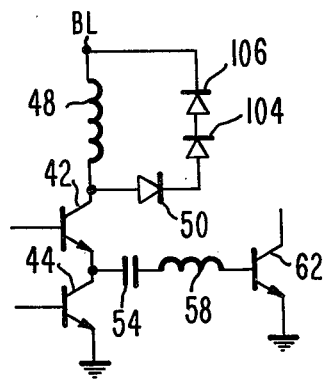

In FIG. 4c, a low-impedance voltage source equivalent to batteries 102 or 108 is implemented by means of additional diodes 104 and 106, serially coupled with diode 50. Any number of diodes may be used to achieve various clamp voltages.

Figure 4D:
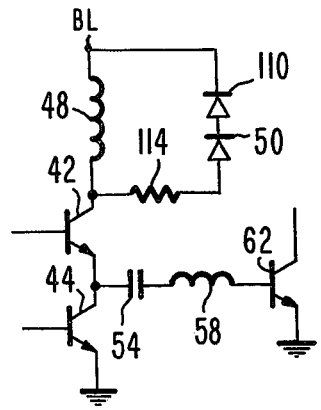

In FIG. 4d, diode 50 is serially coupled with a further diode 110 and with a resistor 114. Since the current in inductor 48 may be expected to be relatively constant when inductor 48 is large, a resistor may be used in conjunction with one or more diodes such as 50 and 110 to establish the clamp voltage. Resistor 114 may be varied for fine adjustment of the clamp voltage.

. It will be apparent to those skilled in the art that inductor 48 may be dimensioned in conjunction with the clamp voltage in such a manner that the energy stored in its magnetic field during the interval in which transistor 42 conducts is exhausted during the succeeding interval in which transistor 44 conducts. With such a dimensioning, current in inductor 48 will decrease to zero in the interval during which transistor 42 is nonconductive, as illustrated by dashed waveform IL648 in FIG. 2d in the interval T2-T3. This allows clamp diode 50 to become nonconductive and voltage V43 at the collector of transistor 42 to decrease to BL, as illustrated by dashed waveform V643 in FIG. 2a. In the next following interval during which transistor 42 is conductive and transistor 44 is nonconductive, current begins to increase from zero in inductor 48 and in the base-emitter junction of transistor 62, as illustrated by dashed waveform IB662 in FIG. 2e. Allowing the current in inductor 48 to decrease towards zero in this manner may be advantageous in television applications since it reduces the base drive of the horizontal output transistor near time T3, which corresponds to the center of horizontal scan at which time the collector current is small, compared with the base drive near time T4, corresponding to the end of scan, when the output transistor collector current is large.

Figure 4E:
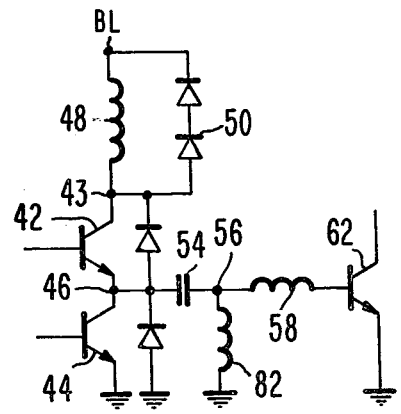

When the base-emitter junction of a horizontal output transistor is the load which is driven by the inventive arrangement, the unidirectional current conduction (rectification) of the base-emitter junction may cause charge to build up on capacitor 54 and disturb the drive performance. FIG. 4e illustrates a preferred manner of driving such a power switching transistor. In FIG. 4e, elements correponding to those of FIG. 1 are designated by the same reference numerals. As illustrated in FIG. 4e, an inductor 82 is coupled between circuit point 56 and ground, and diodes are coupled across transistors 42 and 44 to protect against transient effects. Inductor 82 provides a path for the return of current rectified by the base-emitter junction of transistor 62. Inductor 82 has the further advantage of reducing the current drain of the driver circuit from supply BL for a given forward base drive of transistor 62. During interval T2-T3 or T6-T7 in which transistor 44 is conductive, conventional current flows from ground upward through inductor 82, through capacitor 54 and transistor 44 under the impetus of the voltage on capacitor 54, and energy is stored in the magnetic field associated with inductor 82. During time intervals T3-T4 or T7-T8 during which transistor 44 is nonconductive and transistor 42 is conductive, current flows from supply BL through inductor 48, transistor 42, capacitor 54 and inductor 58 to the base of transistor 62 for biasing the transistor. With transistor 44 nonconductive during conduction of transistor 42, the energy stored in inductor 82 during preceding interval T2-T3 or T6-T7 causes a current to flow in a circular path through inductor 58 and the base-emitter junction of transistor 62, thereby aiding the forward drive current through transistor 42. This reduces the total current required from supply BL.

Figure 5:
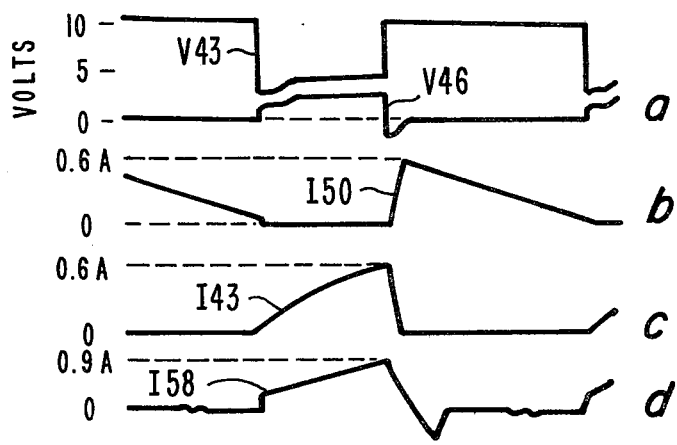
FIG. 5 illustrates certain waveforms for an alternative embodiment of FIG. 4.

FIG. 5 illustrates oscillograms of various amplitude-time waveforms associated with the arrangement of FIG. 4e for the following operating conditions at an operating frequency of 15,750 Hz:

| Supply BL | 9.5 volts |
|---|---|
| Inductor 48 | 130μH, 1.7 Ω |
| 58 | ≈15μH |
| 82 | 600μH |
| Capacitor 54 | 100μF |

In FIG. 5a, V43 and V46 show the effect of momentary conduction of the protection diodes after each transition, and the maximum voltage of V43 can be seen to exceed the 9.5 volt supply potential. The current I50 in clamp diode 50 is zero during the interval in which transistor 42 conducts as illustrated in FIG. 5b, because the diode is back-biased, and in this same interval the collector current I43 of transistor 42 in FIG. 5c increases as current in inductor 48 increases. Increasing current I43 adds to the current then flowing in inductor 82 to create a drive current I58 for the base of transistor 62 as illustrated in FIG. 5d.

Figure 6A:
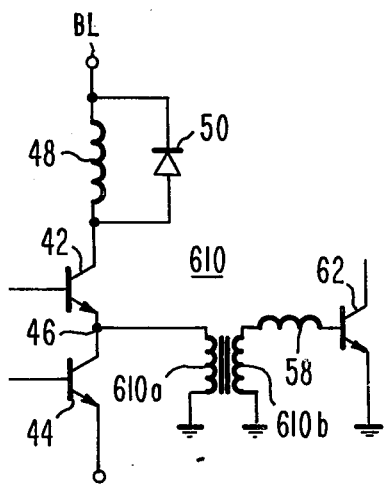
FIG. 6 illustrates alternate embodiments of the invention.
Figure 6B:
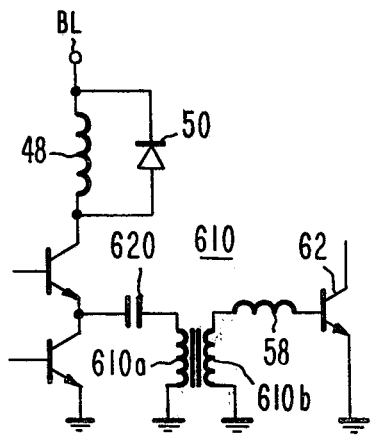

The arrangement of FIG. 6a illustrates alternating-current coupling by means of a transformer designated generally as 610. A primary winding 610a of transformer 610 is coupled between junction point 46 and ground. The emitter of transistor 44 is coupled to a negative direct-voltage source. In FIG. 6b, the need for the negative supply is eliminated by a dc blocking capacitor 620, which allows both primary winding 610a and the emitter of transistor 44 to be coupled to ground. The arrangements of FIG. 6 operate in the same manner as the arrangements of FIGS. 1 and 4. The leakage inductance of winding 610b may be used instead of a discrete inductor 58.

Those skilled in the art will recognize that the described arrangement maintains constant forward drive with changes in duty cycle, notwithstanding that the energy stored in inductor 48 changes, because the inductor is decoupled from the load during a portion of the drive cycle. In this regard, the inventive arrangement differs from the arrangement described in the aforementioned Goodrich patent.

Those skilled in the art will also recognize that the inventive arrangement may be useful in a fixed duty-cycle application as a means for lowering the effective supply voltage applied to the drive. Thus, if a large driver supply voltage will produce excessive base currents in the horizontal output transistor, the inventive arrangement may be used to decrease the effective driver stage supply voltage in a manner dissipating little power. The drive amplifier is a switching amplifier and thus may have unity voltage gain or less.

What is claimed is:

1. An amplifier for driving a switch arrangement through an alternating-current path comprising:
   first and second controllable switch means, each including a controlled main current conducting path and a control electrode, said main current conducting paths being coupled at a juncture to form a first series arrangement and controlled for conduction during alternate on and off intervals to develop a switching voltage at said juncture inclusive of an AC voltage component of substantially square-wave form and a DC component;
   a source of energizing potential;
   inductance means serially coupled with said first series arrangement across said source of energizing potential for establishing the magnitude of said switching voltage during said on interval at less than the full potential of said source of energizing potential;
   alternating-current coupling means coupled to said juncture and to said switch arrangement for applying to said switch arrangement said AC voltage component to the substantial exclusion of said DC component, the polarity of said AC voltage component during said on interval such as to make said switch arrangement conductive during said on interval; and
   means coupled to said inductance means for controlling the voltage across said inductance means during said off interval to vary the voltage across said inductance means during said on interval in a manner which precludes a decrease in the voltage applied to said switch arrangement during said on interval as the duration of said on interval increases relative to the duration of said off interval.

2. An amplifier according to claim 1, wherein said alternating-current coupling means comprises a capacitor.

3. An amplifier according to claim 2, wherein said capacitor has a first electrode coupled to said juncture and a second electrode coupled to said switch arrangement.

4. An amplifier according to claim 1, wherein said means for controlling the voltage across said inductance means comprises a unidirectional current conducting means.

5. An amplifier according to claim 4 wherein said unidirectional current conducting means comprises a semiconductor diode.

6. An amplifier according to claim 5, wherein a first electrode of said diode is coupled to a first electrode of said inductance means, and a second electrode of said diode is coupled to reference voltage source related to said source of energizing potential.

7. An amplifier according to claim 5 wherein said diode is coupled across said inductance means for clamping the voltage across said inductance means during said second time interval.

8. An amplifier according to claim 5 further comprising a reference voltage source and wherein a first electrode of said diode is coupled to an electrode of said inductance means and a second electrode of said diode is coupled to a first terminal of said reference voltage source, and a second terminal of said reference voltage source is coupled to a terminal of said source of energizing potential.

9. An amplifier according to claim 5, wherein said diode is coupled across said inductance means for clamping the voltage thereacross during said second interval and said first and second controllable switch means comprise bipolar transistors.

10. A driver circuit for a horizontal output transistor which promotes the flow of a deflection current in a television apparatus in which the recurrence rate of the deflection is controlled by fixed rate synchronization signals and in which the duty cycle of said horizontal output transistor drive signal is varied, said driver circuit comprising:
first and second controllable switch means, each including a controlled main current conducting path and a control electrode, said main current conducting paths being coupled at a juncture to form a first series path and controlled for conduction during alternate first and second time intervals;
a source of energizing potential;
inductance means serially coupled with said first series path across said source of energizing potential for establishing an operating potential at said juncture during said first interval which is less than the full potential of said source of energizing potential;
alternating-current coupling means coupled to said juncture and to said horizontal output transistor for coupling an AC drive voltage to said horizontal output transistor;
a source of reference potential related to said source of energizing potential; and
clamp means coupled to said inductance means and to said source of reference potential for establishing a voltage across said inductance means during said second interval that causes peak-to-peak voltage variations to be developed across said inductance means with variations in duty cycle.

11. A driver circuit for a horizontal output transistor which promotes the flow of a deflection current in a television apparatus in which the recurrence rate of the deflection is controlled by fixed rate synchronization signals and in which the turn-off of said horizontal output transistor is controlled by a duty cycle controlling feedback loop to maintain the retrace pulses in synchronism with said synchronization signals, said driver circuit comprising:
first and second controllable switch means, each including a controlled main current conducting path and a control electrode, said main current conducting paths being coupled at a juncture to form a first series path and controlled for conduction during alternate first and second time intervals;
a source of energizing potential;
inductance means serially coupled with said first series path across said source of energizing potential for establishing an operating potential across said inductance means during said first interval of a magnitude which is less than the full potential of said source of energizing potential;
alternating-current coupling means coupled to said juncture and to said horizontal output transistor for applying an AC drive to said horizontal output transistor, varying said duty cycle resulting in variation of the peak-to-peak magnitude of said AC drive; and
clamp means coupled across said inductance means for establishing a fixed voltage across said inductance means during said second interval to vary said operating potential such that duty cycle variation results in peak-to-peak magnitude variation of said AC drive of a sense opposite that of the peak-to-peak variation of the voltage across said inductance means.

12. An amplifier for driving a load through an alternating-current path with a signal having duty cycle variations, comprising:
first and second controllable switch means, each including a controlled main current conducting path and a control electrode, said main current conducting paths being coupled at a juncture to form a first series path for the flow of charge and controlled for conduction during alternate first and second time intervals;
a source of energizing potential;
inductance means serially coupled with said first series path across said source of energizing potential for establishing an operating potential across said inductance means during said first interval which is less in magnitude than the full potential of said source of energizing potential, said duty cycle variations causing peak-to-peak voltage variations across said inductance means;
alternating-current coupling means coupled to said juncture and to the load for developing an alternating current voltage across the load; and
means coupled to said inductance means for establishing a voltage across said inductance means during said second interval of a magnitude that results in peak-to-peak voltage variations of said alternating current voltage of a sense opposite that of the peak-to-peak voltage variations across said inductance means.

13. A drive circuit for driving the base of a switching transistor with an alternating-current signal of varying duty cycle, comprising:
an inductor;
a source of voltage;
first switch means coupling said inductor with said base and said source for storing energy in said inductor and for applying a forward drive switching voltage to said base during a first portion of the drive cycle;
second switch means for applying to said inductor a reference voltage during a second portion of said drive cycle to establish by average-value considerations the voltage across said inductor during said first portion of the drive cycle, duty cycle variations causing variations in the voltage across said inductor during said first portion resulting in magnitude variations of said forward drive switching voltage, said reference voltage selected such that the variations of said forward drive switching voltage are in an opposite sense to the variations in the voltage across said inductor during said first portion.

* * * * *